US010014238B2

(12) United States Patent
Miller

(10) Patent No.: US 10,014,238 B2
(45) Date of Patent: Jul. 3, 2018

(54) METHOD, SYSTEM, AND ELECTRONIC ASSEMBLY FOR THERMAL MANAGEMENT

(71) Applicant: GE Energy Power Conversion Technology Ltd, Rugby, Warwickshire (GB)

(72) Inventor: Zane Taylor Miller, Salem, VA (US)

(73) Assignee: GE ENERGY POWER CONVERSION TECHNOLOGY LTD, Rugby (GB)

( * ) Notice: Subject to any disclaimer, the term of this patent is extended or adjusted under 35 U.S.C. 154(b) by 0 days.

(21) Appl. No.: 15/214,284

(22) Filed: Jul. 19, 2016

(65) Prior Publication Data

US 2018/0025963 A1 Jan. 25, 2018

(51) Int. Cl.
| | |
|---|---|
| *H01L 23/24* | (2006.01) |
| *H01L 23/467* | (2006.01) |
| *H01L 23/367* | (2006.01) |
| *H01L 23/00* | (2006.01) |
| *H01L 25/07* | (2006.01) |
| *H01L 25/00* | (2006.01) |
| *H01L 23/373* | (2006.01) |

(52) U.S. Cl.
CPC ........ *H01L 23/467* (2013.01); *H01L 23/3672* (2013.01); *H01L 23/3675* (2013.01); *H01L 24/32* (2013.01); *H01L 25/072* (2013.01); *H01L 25/50* (2013.01); *H01L 23/3736* (2013.01); *H01L 2224/32245* (2013.01); *H01L 2924/01013* (2013.01); *H01L 2924/01029* (2013.01); *H01L 2924/1033* (2013.01); *H01L 2924/10272* (2013.01); *H01L 2924/13055* (2013.01); *H01L 2924/13091* (2013.01)

(58) Field of Classification Search
CPC ........... H01L 2224/32245; H01L 24/32; H01L 25/50; H01L 25/072; H01L 23/3672; H01L 23/467; H01L 23/3675
USPC ......................................................... 257/721
See application file for complete search history.

(56) References Cited

U.S. PATENT DOCUMENTS

| 4,398,208 | A | | 8/1983 | Murano et al. | |
|---|---|---|---|---|---|
| 5,294,831 | A | * | 3/1994 | Azar ........................ | F28F 3/02 165/80.3 |
| 8,291,967 | B2 | * | 10/2012 | Yoshida .................... | F28F 3/02 165/104.21 |

(Continued)

FOREIGN PATENT DOCUMENTS

WO 2016/021565 A1 2/2016

OTHER PUBLICATIONS

Extended European Search Report and Opinion issued in connection with corresponding EP Application No. 17180914.8 dated Dec. 21, 2017.

*Primary Examiner* — Luan C Thai
(74) *Attorney, Agent, or Firm* — GE Global Patent Operation; Scott R. Stanley

(57) ABSTRACT

There are provided methods, systems, and electronic assemblies for efficient thermal management in electronics applications. For example, there is provided an electronic assembly that includes a thermal management system that can include a heat sink having electronic components mounted thereon. The electronic components can be mounted on the heat sink in a staggered pattern along a centerline substantially perpendicular to a direction of flow of a coolant.

19 Claims, 6 Drawing Sheets

(56) References Cited

U.S. PATENT DOCUMENTS

| | | | | |
|---|---|---|---|---|
| 8,378,347 B2* | 2/2013 | Shimizu | ............... | H01L 24/97 257/100 |
| 2008/0123367 A1* | 5/2008 | Pan | ............... | G02B 6/0025 362/628 |
| 2011/0132591 A1* | 6/2011 | Morino | ............... | B21D 53/04 165/185 |
| 2014/0347818 A1 | 11/2014 | Uhlemann et al. | | |

* cited by examiner

METHOD, SYSTEM, AND ELECTRONIC ASSEMBLY FOR THERMAL MANAGEMENT

I. TECHNICAL FIELD

The present disclosure relates to electronic assemblies. More particularly, the present disclosure relates to methods and systems for thermal management in electronic assemblies.

II. BACKGROUND

Semiconductor chips are typically rated for operation in a given temperature range. During normal operation, a chip often generates more heat energy than its package alone can dissipate to the immediately surrounding environment. If this surplus heat is not properly extracted, the chip will perform erroneously, it can be irreparably damaged, and it will certainly fail long before its expected lifespan. Consequently, electronic components such as semiconductor chips are typically coupled to thermal management systems that extract heat and ensure the components remain in their rated temperature range.

Furthermore, in some electronic assemblies, thermal performance is highly correlated with electrical performance. For example and not by limitation, in a typical power converter, increasing thermal performance, i.e. extracting more heat from the converter, yields a higher current-carrying capacity, and the constituent components can remain in their rated temperature range during operation despite running at a higher current. Alternatively, increasing thermal performance can also mean that the power converter can operate with fewer components while running at a specified current.

In either one of the aforementioned cases, there exists a tradeoff between thermal management system cost and complexity and electrical performance, i.e. the output power rating in kilo-Volt-Amperes (kVA) of the power converter. Conventional paradigms in thermal management include providing additional resources for increasing performance. For example, additional hardware or energy can be devoted to providing increased airflow to cool switches and thus provide a higher kVA rating.

III. SUMMARY

The embodiments featured herein can help mitigate the above noted tradeoffs as well as solve other issues known in the art. Some of the embodiments can provide a method for balancing die temperatures in an electronic assembly. The method can improve the thermal performance of an electronic component assembly, which translates directly to improved electrical performance.

Some embodiments can include an air-cooled semiconductor bridge assembly in which switches included in the assembly are oriented in an alternating pattern over a heat sink to improve the overall thermal performance of the semiconductor bridge assembly. As such, some of the exemplary embodiments can provide improved thermal performance without the cost of additional heat sink material, air flow, or pressure drop across a heat sink.

One embodiment provides an electronic assembly that can include a thermal management system. The thermal management system can include a heat sink having a plurality of dies mounted thereon in a staggered pattern along a centerline substantially perpendicular to a direction of flow of a coolant.

Another embodiment provides an electronic assembly that can include a thermal management system. The thermal management system can include a heat sink having a plurality of electronic components mounted thereon in a staggered pattern along a centerline substantially perpendicular to a direction of flow of a coolant.

Another embodiment provides a method for use with an electronic assembly. The method can include mounting a plurality of electronic components on a heat sink in a staggered pattern along a centerline of a heat sink. The centerline can be in a direction substantially perpendicular to a flow direction of a coolant of the heat sink.

Additional features, modes of operations, advantages, and other aspects of various embodiments are described below with reference to the accompanying drawings. It is noted that the present disclosure is not limited to the specific embodiments described herein. These embodiments are presented for illustrative purposes only. Additional embodiments, or modifications of the embodiments disclosed, will be readily apparent to persons skilled in the relevant art(s) based on the teachings provided.

IV. BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various drawings. The drawings are only for purposes of illustrating the embodiments and are not to be construed as limiting the disclosure. Given the following enabling description of the drawings, the novel aspects of the present disclosure should become evident to a person of ordinary skill in the relevant art(s).

V. DETAILED DESCRIPTION

While the illustrative embodiments are described herein for particular applications, it should be understood that the present disclosure is not limited thereto. Those skilled in the art and with access to the teachings provided herein will recognize additional applications, modifications, and embodiments within the scope thereof and additional fields in which the present disclosure would be of significant utility.

Figure 1:
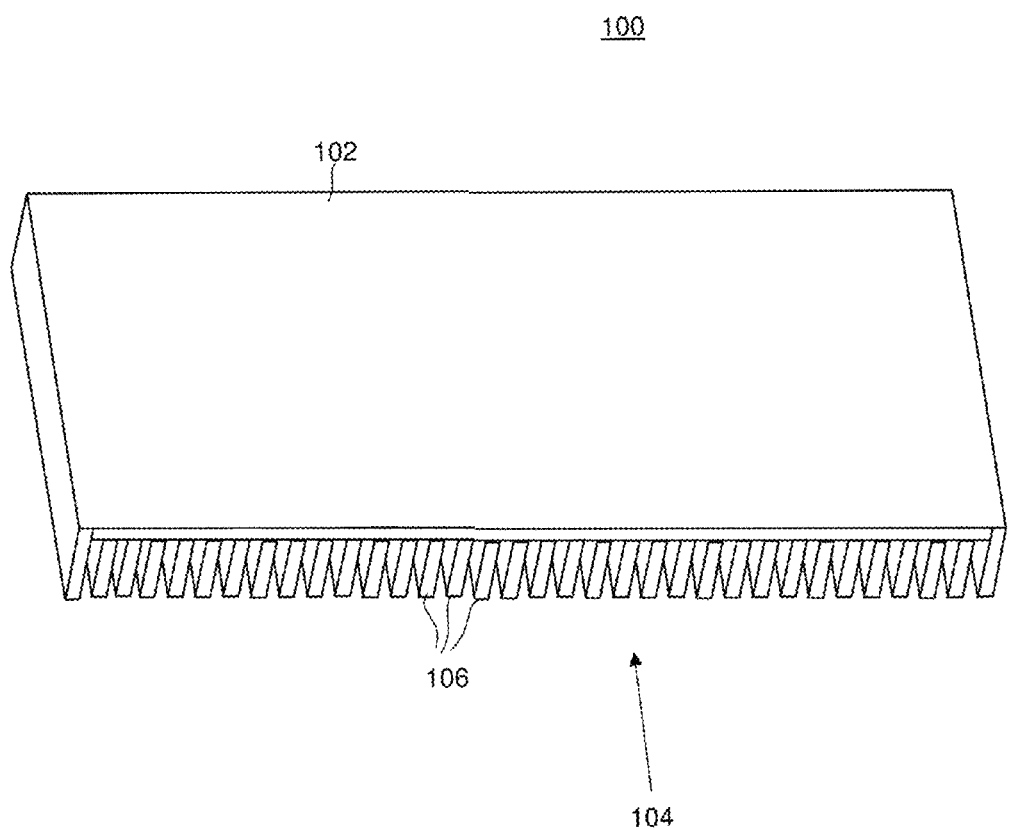
FIG. 1 illustrates a heat sink according to various aspects described herein.

FIG. 1 illustrates a heat sink 100 according to various aspects described herein. The heat sink 100 can be part of a thermal management system of an electronic assembly. For example and not by limitation, the heat sink 100 can be part of an electronic assembly that can include a plurality of electronic components that cooperatively or individually function to process electrical signals such as voltage and/or current. The heat sink 100 can be used to extract heat from the components in order to ensure that they remain in their rated temperature or rated temperature range so that they perform optimally.

A rated temperature or rated temperature range of one or more of the components can be thought of generally as the ambient temperature or temperature range in which the one or more components performs optimally. Alternatively, the rated temperature or temperature range can relate to the die temperature of the components, i.e. the temperature or temperature range at which a semiconductor die included in the components must be maintained in order for the circuits integrated thereon to perform optimally.

Generally, the heat sink 100 can be any passive heat exchanger that is configured, i.e. in shape and by virtue of its constituent material, to transfer heat generated by electronic components mounted thereon. The constituent material of the heat sink 100 can be copper, aluminum, or a combination thereof. Generally, the constituent material can be any material that has sufficient heat dissipation ability to satisfy the requirements of a given application.

Furthermore, and as shall be seen below, the components can be mounted on a dorsal portion 102 of the heat sink 100. In some embodiments, mounting the electronic components on the dorsal portion 102 can be achieved with a thermally conductive adhesive or with a thermally conductive grease. Once mounted, the heat generated by the components can be transferred to a fluid flowing in a direction 104 under the dorsal portion 102 of the heat sink 100.

The heat sink 100 can include a plurality of protrusions 106 that are configured to provide significant coolant/heat sink surface interaction without creating significant resistance (i.e. pressure drop) to coolant flow. The protrusions 106 thus can serve as passive structures that allow efficient transfer of the heat generated by the components mounted onto the dorsal portion 102. The fluid can be liquid or gaseous. Generally, any coolant, whether it be single phase or multi-phase can be used with the heat sink 100. Together with the hardware for circulating the fluid (e.g. fans, pumps, tubes), the heat sink 100 can form part of a thermal management system that is configured to regulate the temperature of the electronic components mounted on the dorsal portion 102.

In a wide variety of application, the electronic components may include a package that provides some measure of heat dissipation. For example, the package of an electronic component can be designed to dissipate the heat produce by a semiconductor die included therein during operation. Nevertheless, in some applications, a heat sink such as the heat sink 100 is still needed because the package cannot fully provide the level of heat exchange that is required to allow the component to perform optimally.

Moreover, it is noted that while the heat sink 100 is shown in FIG. 1 as being rectangular, the heat sink 100 can take any form, without departing from the scope of the disclosure. For example, the heat sink 100 can have a circular footprint.

Figure 2:
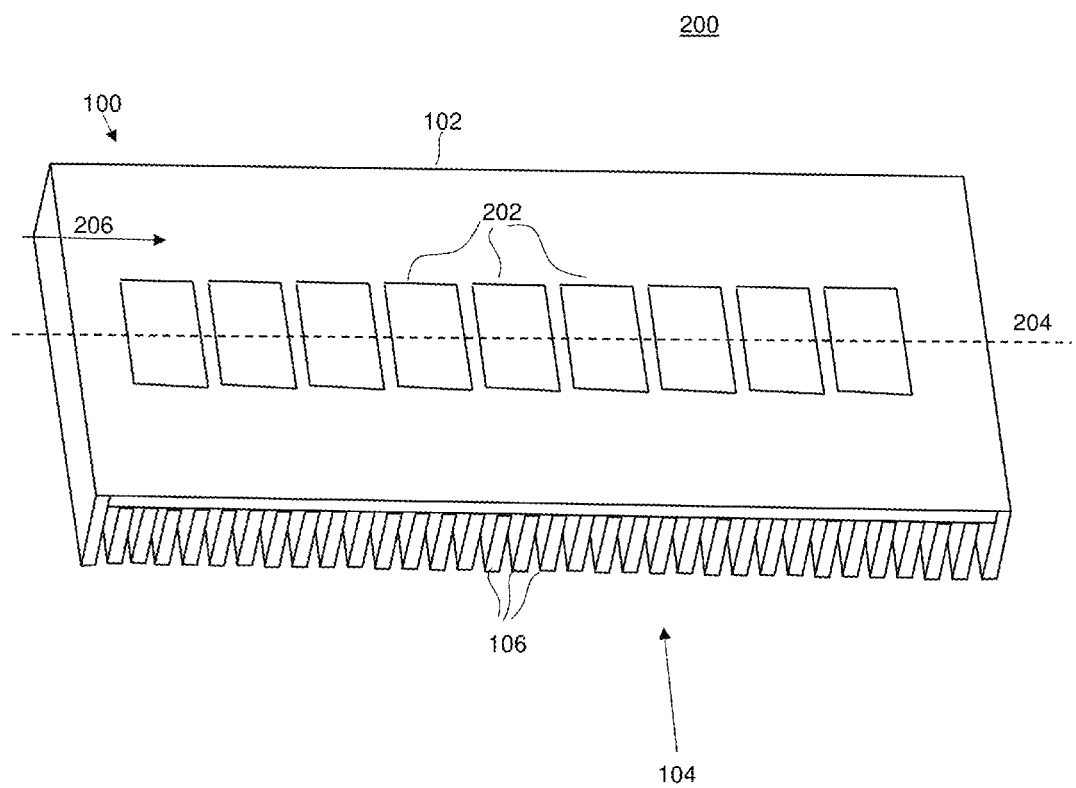
FIG. 2 illustrates a conventional electronic assembly using a heat sink.

FIG. 2 illustrates a traditional electronic assembly 200 that can include the heat sink 100. The plurality of electronic components 202 are mounted along a line 204 in a direction 206. The line 204 can be a centerline of the heat sink, i.e. it is substantially coincident with an axis of symmetry of the heat sink 100. The electronic components 202 can be, for example, power electronics devices. Each of the electronic components 202 can include a plurality of semiconductor dies that include integrated circuits.

In the traditional electronic assembly 200 and when air is used as the coolant, the thermal load of the heat sink 100 is aligned down the middle of the heat sink 100, along the line 204 in the direction 206. This arrangement creates regions of heat flux on the heat sink 100 that are either too high or too low for optimal heat transfer to the air flowing in the direction 104. As the air travels across the heat sink 100 through the protrusions 106, it encounters entry and exit regions where it is capable of picking up more heat from the heat sink 100 than is available. Moreover, as the air passes through the central region where most of the heat is concentrated, more heat is available than the air is capable of accepting. Both scenarios lead to less than optimal thermal performance, and hence less than optimal electrical performance.

Figure 3:
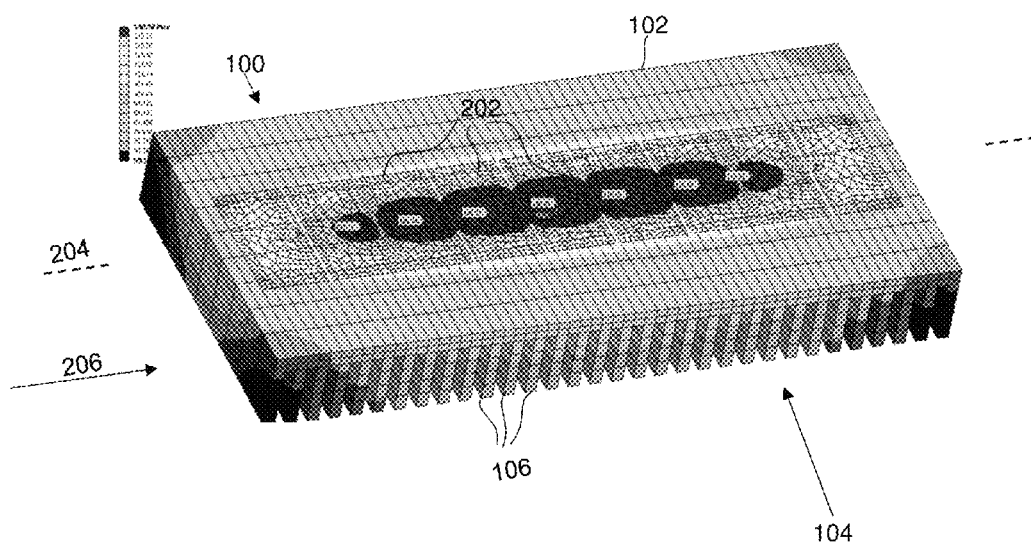
FIG. 3 illustrates a finite element simulation map of a conventional electronic assembly.

Furthermore, in the traditional electronic assembly 200, the components 202 that are at the center of the arrangement shown are being heated by their neighbors more than the components 202 that are placed outwardly in the arrangement. This gradient in temperature can cause performance differences from one component 202 to another, as illustrated in FIG. 3, which shows the finite element simulation map 300 of the traditional electronic assembly 200. Specifically, the finite element simulation map 300 shows, from left to right the components 202 having maximum temperatures of 129.70° C., 137.15° C., 140.72° C., 140.95° C., 140.65° C., 139.68° C., 137.13° C., and 129.70° C. As such, the finite element simulation map 300 shows issues that are typically encountered in the electronic assembly 200, namely, the presence of a large temperature gradient across the components 202 and the components 202 central to the assembly being hotter than the components placed on the edges.

Figure 4:
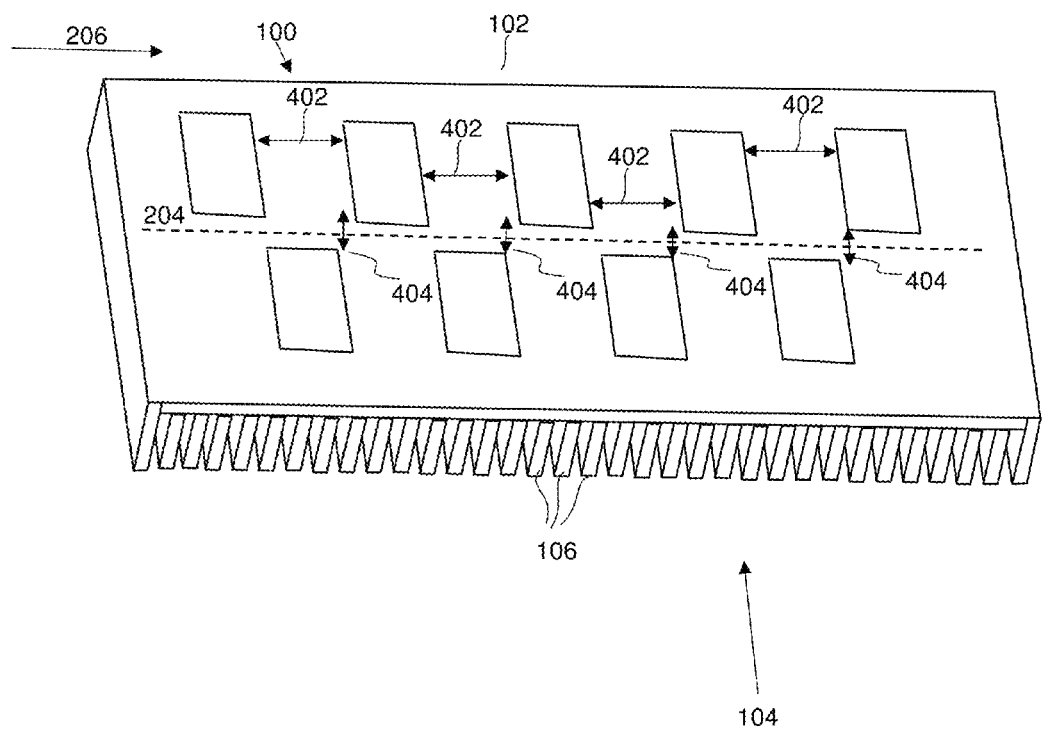
FIG. 4 illustrates an electronic assembly according to an embodiment.

FIG. 4 illustrates an electronic assembly 400 according to an embodiment. The electronic assembly 400 can include a thermal management system that includes the heat sink 100. The heat sink 100 can have a plurality of dies mounted thereon. (The plurality of dies can be the plurality of electronic components 202 shown in FIG. 4). The plurality dies or components 202 can be mounted in a staggered pattern along the line 204 in the direction 206, which is substantially perpendicular to the direction 104, which is the direction of coolant flow in the thermal management system. In some embodiments, the coolant can be air and the plurality of dies or components 202 can form or include a semiconductor bridge assembly for use in power electronics application. In such cases, the electronic assembly 400 can be part of a power conversion module.

The semiconductor bridge assembly can include a plurality of switches implemented using transistor technology known in the art. For example, the semiconductor bridge assembly can include insulated gate bipolar transistors (IGBTS) or metal-oxide semiconductor field effect transistors (MOSFETS). Furthermore, the bridge assembly can include power MOSFETs, silicon carbide MOSFETs, silicon carbide IGBTs, and Gallium Nitride MOSFETs, for example. Generally, for power electronics applications, the bridge assembly can include switches that are integrated on the semiconductor dies.

In some embodiments, the staggered pattern can include a first separation distance 402 with which components 202 are tiled along the line 204, i.e. in the direction 206. The staggered pattern can further include a second separation distance 404 with which the components 202 are tiled vertically across the line 204. Generally, the pattern can include the first separation distance 402 according to which a first set of dies are disposed along a centerline of the heat sink 100 and the second separation distance 404 according to which a second set of dies are disposed substantially perpendicular to the same centerline. In some embodiments, the first separation distance 402 and the second separation distance 404 can be substantially equal, while in other embodiments, these distances may be substantially different. Furthermore, while only two rows of components 202 are shown, the electronic assembly 400 can include more than two rows without departing from the scope of the present disclosure.

In some embodiments each of the first separation distance 402 and the second separation distance 404 can be selected such the heat dissipation areas of any two dies or components do not overlap. The heat dissipation area of a die or component 202 can be the area corresponding to a spatial heat dissipation figure (e.g. heat flux or temperature) produced by the die or component during operation. In some embodiments, the heat dissipation area can be chosen as the area over which the spatial heat dissipation figure satisfies a predetermined condition. For example and not by limitation, the predetermined condition can be that the temperature in the heat dissipation area remains greater than a minimum threshold temperature.

In the electronic assembly 400, by alternating the position of each component 202 forward and backward of the line 204 of the heat sink 100, which is perpendicular to the coolant flow direction, the thermal load on the heat sink 100 can be distributed significantly better than in the case of the electronic assembly 200. As evidenced in the finite element map 500 of the electronic assembly 400 shown in FIG. 5, the staggered pattern can reduce heat flux gradients in the heat sink 100, thus lowering the thermal resistance of the electronic assembly 400 with respect to that of the electronic assembly 200.

Figure 5:
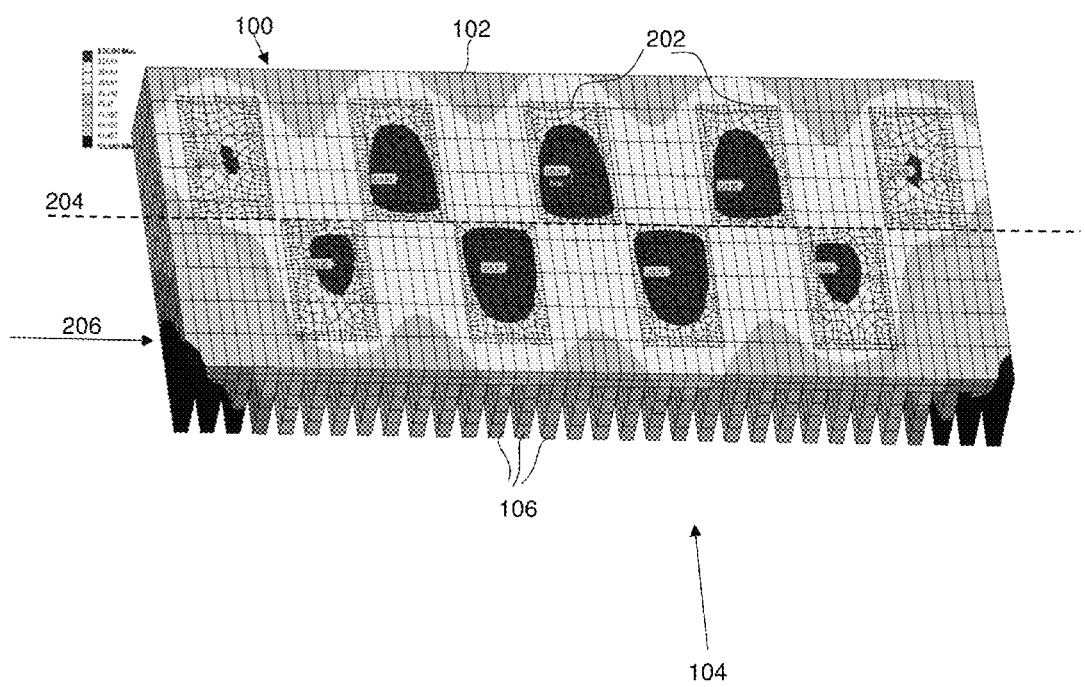
FIG. 5 illustrate a final element simulation map according to an embodiment.

The staggered pattern can also provide better balancing temperatures for the components 202. Specifically, as shown in FIG. 5, due to the staggered pattern, the maximum temperature occurring in the system is reduced to 125.93° C., as opposed to the maximum temperature of 140.95° C. in the case of the electronic assembly 200. Furthermore, in the electronic assembly 400, according to the finite element simulation map 500, the variance in temperature from component to component is much reduced in comparison to the variance in the electronic assembly 200.

Table 1 and Table 2 provide a quantitative view of the thermal performance of the electronic assembly 200 and the electronic assembly 400, respectively. The tables show, for each of the component 202 shown in FIGS. 2 and 4, the maximum temperature (denoted "Max Temp") achieved in the thermal management system, the deviation from a 22 degree C. ambient temperature (denoted "Delta T"), and the thermal resistance of the heat sink 100. As can be seen in Tables 1 and 2, the electronic assembly 200 has a 15% higher thermal resistance and 43% higher standard deviation in component temperatures than the electronic assembly 400, when considering the average thermal resistance and the standard deviation in temperature for each one of the data sets.

TABLE 1

Thermal Performance of the Electronic Assembly 200

| Component 202 | Max Temp [degree C.] | Delta T (ambient 22 degree C.) | Thermal Resistance [degree C./Watt] |
|---|---|---|---|
| 1 | 129.7 | 107.7 | 0.1077 |
| 2 | 137.15 | 115.15 | 0.11515 |
| 3 | 139.74 | 117.74 | 0.11774 |
| 4 | 140.72 | 118.72 | 0.11872 |
| 5 | 140.95 | 118.95 | 0.11895 |
| 6 | 140.65 | 118.65 | 0.11865 |
| 7 | 139.68 | 117.68 | 0.11768 |
| 8 | 137.13 | 115.13 | 0.11513 |
| 9 | 129.7 | 107.7 | 0.1077 |

TABLE 2

Thermal Performance of the Electronic Assembly 400

| Component 202 | Max Temp [C.] | Delta T (ambient 22 degree C.) | Thermal Resistance [C/W] |
|---|---|---|---|
| 1 | 118.37 | 96.37 | 0.09637 |
| 2 | 121.15 | 99.15 | 0.09915 |
| 3 | 124.84 | 102.84 | 0.10284 |
| 4 | 125.77 | 103.77 | 0.10377 |
| 5 | 125.93 | 103.93 | 0.10393 |
| 6 | 125.75 | 103.75 | 0.10375 |
| 7 | 124.85 | 102.85 | 0.10285 |
| 8 | 121.03 | 99.03 | 0.09903 |
| 9 | 118.55 | 96.55 | 0.09655 |

Figure 6:
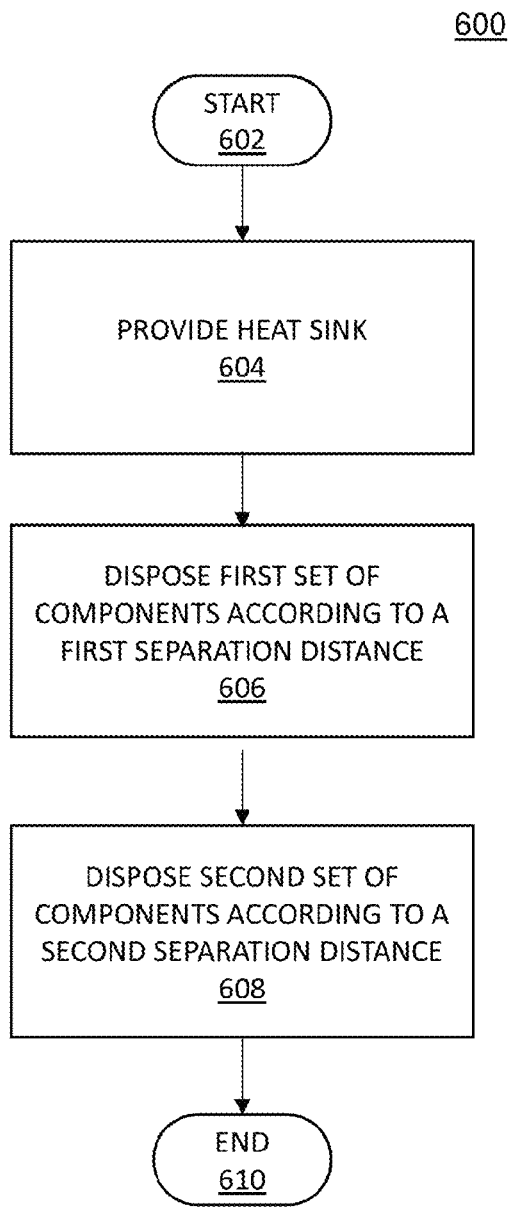
FIG. 6 depicts a flow chart of a method, according to an embodiment.

Having set forth various embodiments, an exemplary method 600 of assembly consistent with their operations is now described with respect to FIG. 6. The method 600 can be used to assemble the electronic assembly 400, and it can begin at block 602 and end at block 610. The method 600 can include providing a heat sink (block 604) and mounting a plurality of electronic components on a dorsal portion of the heat sink (blocks 606 and 608). The mounting can include disposing a first set of components according to a first separation distance (block 606) on the heat sink and disposing a second set of chips according to a second separation distance (block 608) on the heat sink to create a staggered pattern along a centerline of the heat sink, the centerline being in a direction substantially perpendicular to a flow direction of a coolant of the heat sink.

In some embodiments, the first separation distance and the second separation distance are substantially equal. In other embodiments, first separation distance and the second separation distance are substantially different. In the method 500, the plurality of electronic components include a plurality of semiconductor switches, which can form a semiconductor bridge assembly.

In conclusion, the embodiments allow significant improvements in thermal performance, and hence in electrical performance. For example, when considering the electronic assemblies 200 and 400, finite element analyses were run with the same thermal loads, convection coefficients, air temperatures, and material properties. The finite element simulation maps 300 and 500 showed a 15% decrease in thermal resistance and a 43% reduction in the standard deviation of die temperatures resulting from the electronic assembly 400 in comparison to the electronic assembly 200.

Further analyses have shown the geometry of the staggered pattern (i.e. the first and second separation distances mentioned above) greatly influence thermal performance. Specifically, it was found that thermal performance is proportional to how far the components 202 are pushed apart relative to each other and to the line 204, at least up to the point that the components 202 no longer thermally influence each other, i.e. when their heat dissipation areas do not overlap.

Thermal performance optimization can be performed by the individual placement of the thermal loads (i.e. the dies or components 202), while maintaining the staggered pattern, to create optimal conditions of maximum heat transfer and yield overall reduced die temperatures and die temperature variation.

In one example, if two loads have relatively lower heat dissipation than the rest of the loads, then those two loads can be mounted closer to one another. Conversely, loads that have larger heat dissipation can be spaced farther apart.

In another example, thermal performance can be optimized by considering the cross-sectional velocity profile of the coolant. Specifically, in the case of an air coolant produced by a fan, the fan's exit air velocity spatial profile can have a donut shape. Taking a cross-section of the profile yields successive regions having low, high, low, high, and low air velocities, and thermal performance can be optimized by placing the thermal loads accordingly. Specifically, the distance between the thermal loads can be varied from large to small to create a pattern (large, small, large, small, large) to correspond respectively to the low, high, low, high, and low air velocity regions.

In yet other examples, thermal performance can be optimized by considering edge effects (components placed near heat sink edges have fewer neighbors than those in the middle) or by considering the duct work's structure (i.e. the spacing between the protrusions of the heat sink). In the latter example, air can naturally be slowed down near the edges of a duct, thus loads can be placed slight farther apart for to account for the reduced air velocity at the ducts' edges.

Generally, optimization can be performed based on or more factors affecting thermal performance. For example, optimization can be based on a combination of all the factors described above. As such, exemplary electronic assemblies according to the teachings featured herein can include components that are assembled in a staggered pattern on a heat sink, but with varied inter-component spacing, in either one or both the direction along the centerline of the heat sink or the direction substantially perpendicular to the centerline.

The embodiments thus have several advantages for power converters. The system design of a power converter typically balances the cost of additional transistor switches against the cost of heat sink performance and additional airflow to optimize for the lowest possible system cost per KVA of power converted. The ability to increase the thermal performance of a heat sink, as provided by the embodiments, means that a given switch can run more current, or a given converter can run the same current with less switches. Both cases result in more KVA of power converted per unit of material and energy cost. Further, since power converter ratings are very sensitively coupled to their heat sinks thermal resistance, the embodiments can yield higher power converter ratings because lowering the thermal resistance of the heat sink by just a few C/W can result in tenths of Megawatts of power conversion capability.

Those skilled in the relevant art(s) will appreciate that various adaptations and modifications of the embodiments described above can be configured without departing from the scope and spirit of the disclosure. Therefore, it is to be understood that, within the scope of the appended claims, the disclosure may be practiced other than as specifically described herein.

What is claimed is:

1. An electronic assembly, comprising:
a thermal management system including:
a heat sink having a plurality of dies mounted thereon in a staggered pattern along a centerline substantially perpendicular to a direction of flow of a coolant, the staggered pattern of the plurality of dies causing a decrease in a thermal resistance of the heat sink.

2. The electronic assembly of claim 1, wherein the coolant is air.

3. The electronic assembly of claim 1, wherein some of the dies of the plurality of dies form a bridge assembly.

4. The electronic assembly of claim 3, wherein the bridge assembly includes a plurality of switches selected from the group consisting of insulated gate bipolar transistors (IGBTs) and metal-oxide semiconductor field-effect transistors (MOSFETs).

5. The electronic assembly of claim 4, wherein the group includes power MOSFETs, silicon carbide MOSFETs, silicon carbide IGBTs, and Gallium Nitride MOSFETs.

6. The electronic assembly of claim 3, wherein the bridge assembly includes a plurality of semiconductor switches.

7. The electronic assembly of claim 1, wherein the pattern includes a first separation distance according to which a first set of dies are disposed along the centerline and a second separation distance according to which a second set of dies are disposed substantially perpendicular to the centerline.

8. The electronic assembly of claim 7, wherein the first separation distance and second separation distance are substantially equal.

9. The electronic assembly of claim 7, wherein the first separation distance and the second separation distance are substantially different.

10. The electronic assembly of claim 7, wherein each of the first separation distance and the second separation distance are each selected so that heat dissipation areas of any two dies do not overlap.

11. The electronic assembly of claim 1, wherein the thermal management system is included in a power conversion module.

12. An electronic assembly, comprising:
a thermal management system including:
a heat sink having a dorsal portion and a plurality of protrusions, the plurality of protrusions being in contact with a coolant flowing through the heat sink;
a plurality of electronic components mounted on the dorsal portion of the heat sink in a staggered pattern along a centerline substantially perpendicular to a direction of flow of the coolant;
wherein the heat sink has a decreased thermal resistance due to the staggered pattern of the plurality of electronic components.

13. The electronic assembly of claim 12, wherein the coolant is air.

14. A method for use with an electronic assembly, comprising:
mounting a plurality of electronic components on a heat sink in a staggered pattern along a centerline of a heat sink, the centerline being in a direction substantially perpendicular to a flow direction of a coolant of the heat sink, the staggered pattern of the plurality of electronic components causing a decrease in a thermal resistance of the heat sink.

15. The method of claim 14, wherein the plurality of electronic components include a plurality of semiconductor switches.

16. The method of claim 15, wherein the plurality of switches form a semiconductor bridge assembly.

17. The method of claim 14, wherein the mounting includes disposing a first set electronic components according to a first separation distance and a second set of electronic components according to a second separation distance.

18. The method of claim 17, wherein the first separation distance and the second separation distance are substantially equal.

19. The method of claim 17, wherein the first separation distance and the second separation distance are substantially different.

* * * * *